(12) United States Patent
Mizumura et al.

(10) Patent No.: US 8,953,146 B2
(45) Date of Patent: Feb. 10, 2015

(54) EXPOSURE APPARATUS FOR IMPROVING ALIGNMENT ACCURACY OF A PATTERN GENERATED BY LIGHT MODULATING ELEMENTS

(75) Inventors: Michinobu Mizumura, Yokohama (JP); Koichiro Fukaya, Yokohama (JP); Tetsuo Ando, Yokohama (JP)

(73) Assignee: V Technology Co., Ltd., Yokohama-shi (JP)

( * ) Notice: Subject to any disclaimer, the term of this patent is extended or adjusted under 35 U.S.C. 154(b) by 683 days.

(21) Appl. No.: 13/206,794

(22) Filed: Aug. 10, 2011

(65) Prior Publication Data

US 2011/0292368 A1 Dec. 1, 2011

Related U.S. Application Data

(63) Continuation of application No. PCT/JP2010/052919, filed on Feb. 25, 2010.

(30) Foreign Application Priority Data

Feb. 26, 2009 (JP) .................. 2009-043981

(51) Int. Cl.
*G03F 7/20* (2006.01)
*G03F 9/00* (2006.01)

(52) U.S. Cl.
CPC .......... *G03F 7/70291* (2013.01); *G03F 9/7088* (2013.01)
USPC ............................................. 355/67; 355/77

(58) Field of Classification Search
CPC ............ G03F 7/70291; G03F 7/70391; G03F 7/7005; G03F 7/70383
USPC ....................................................... 355/67, 72
See application file for complete search history.

(56) References Cited

U.S. PATENT DOCUMENTS

| | | | |
|---|---|---|---|
| 2002/0141024 A1* | 10/2002 | Retschke et al. | 359/204 |
| 2004/0042213 A1* | 3/2004 | Kimura et al. | 362/317 |
| 2004/0189970 A1* | 9/2004 | Takada | 355/67 |
| 2005/0157161 A1 | 7/2005 | Fukuda | |
| 2006/0132745 A1 | 6/2006 | Ikedo | |

(Continued)

FOREIGN PATENT DOCUMENTS

| | | |
|---|---|---|
| JP | 04-191741 A | 7/1992 |
| JP | 2004-191741 A | 7/1992 |

(Continued)

*Primary Examiner* — Peter B Kim
*Assistant Examiner* — Michelle Iacoletti
(74) *Attorney, Agent, or Firm* — Finnegan, Henderson, Farabow, Garrett & Dunner, L.L.P.

(57) ABSTRACT

An exposure apparatus is provided with: a conveying device that conveys the subject to be exposed in a given direction; a spatial light modulating device having a plurality of light modulating elements, which are composed of an electro-optical crystalline material and arranged at least in one row in a direction intersecting a conveying direction of the subject to be exposed; an optical beam shaping device that limits the width of light emitted from each light modulating element in the conveying direction to a predetermined width; and a control device that on/off-controls light transmitted through the spatial light modulating device so as to generate a predetermined pattern. The light modulating element is formed tilted by a predetermined angle with respect to an axis parallel to the conveying direction. The control device shifts the optical beam shaping device in the conveying direction.

4 Claims, 8 Drawing Sheets

(56) References Cited

U.S. PATENT DOCUMENTS

2009/0097002 A1     4/2009    Fukuda et al.
2010/0195078 A1     8/2010    Horiuchi et al.

FOREIGN PATENT DOCUMENTS

| | | |
|---|---|---|
| JP | 2004-317593 A | 11/2004 |
| JP | 2004-317693 A | 11/2004 |
| JP | 2005-203697 | 7/2005 |
| JP | 2006-173470 A | 6/2006 |
| JP | 2006-349945 A | 12/2006 |
| JP | 2007-017895 | 1/2007 |
| JP | 2007-310251 | 11/2007 |
| JP | 2008-176257 A | 7/2008 |
| JP | 2008-263090 | 10/2008 |
| WO | PCT/JP2010/052919 | 2/2010 |

\* cited by examiner

# EXPOSURE APPARATUS FOR IMPROVING ALIGNMENT ACCURACY OF A PATTERN GENERATED BY LIGHT MODULATING ELEMENTS

This application is a continuation of PCT/JP2010/052919, filed on Feb. 25, 2010.

BACKGROUND OF THE INVENTION

1. Field of the Invention

The present invention relates to an exposure apparatus that generates a predetermined pattern by means of a plurality of light modulating elements composed of an electro-optical crystalline material, and exposes the predetermined pattern on a subject to be exposed, while conveying the subject to be exposed in a given direction. More specifically, the present invention relates to an exposure apparatus that attempts to enhance alignment accuracy of a pattern generated by the plurality of light modulating elements, and an exposure position of the subject to be exposed.

2. Description of Related Art

A conventional exposure apparatus of this type includes: a stage on which the subject to be exposed is placed and held on an upper surface thereof; a light source arranged above the stage to emit light; a spatial light modulating device arranged between the stage and the light source, in which the plurality of light modulating elements provided with a pair of electrodes facing a side face parallel to a long axis direction of an elongated member composed of the electro-optical crystalline material are two-dimensionally arranged, designating opposite ends thereof as an incident end face and an emission end face of light from the light source, to generate a predetermined pattern by optically modulating transmitted light from the respective light modulating elements and expose the predetermined pattern on the subject to be exposed; and a control device that individually performs drive control of each light modulating element of the spatial light modulating device to generate a predetermined pattern (for example, refer to Japanese Laid-open (Kokai) Patent Application Publication No. 2007-310251).

However, in such a conventional exposure apparatus, alignment of the pattern generated by the plurality of light modulating elements of the spatial light modulating device and the exposure position of the subject to be exposed needs to be performed by shifting either one of the spatial light modulating device and the subject to be exposed in a direction substantially orthogonal to a conveying direction of the subject to be exposed in a plane parallel to the upper surface of the stage, and alignment accuracy is subject to the restriction of mechanical accuracy of an alignment mechanism. Therefore, it has been difficult to perform the alignment with accuracy equal to or less than the resolution of an exposure pixel irradiated onto the subject to be exposed.

SUMMARY OF THE INVENTION

Accordingly, in view of the above-mentioned problems, the present invention has an object to provide an exposure apparatus that improves alignment accuracy of the pattern generated by the light modulating elements composed of the electro-optical crystalline material, and the exposure position of the subject to be exposed.

In order to achieve the object, the exposure apparatus according to a first aspect of the present invention includes: a conveying device that places a subject to be exposed on an upper surface thereof and conveys the subject to be exposed in a given direction; a spatial light modulating device having a plurality of light modulating elements, which are composed of an electro-optical crystalline material and arranged at a predetermined pitch at least in one row in a direction intersecting a conveying direction of the subject to be exposed in a plane parallel to the upper surface of the conveying device; an optical beam shaping device that limits the width of light entering into each light modulating element or emitted from each light modulating element in the conveying direction to a predetermined width; and a control device that on/off-controls light transmitted through the spatial light modulating device by individually driving each light modulating element so as to generate a predetermined pattern. In each light modulating element, a cross-sectional shape that orthogonally intersects an optical axis thereof is formed in a substantially rectangular shape, which is long in the conveying direction of the subject to be exposed, and the light modulating element is formed tilted by a predetermined angle with respect to an axis parallel to the conveying direction. The control device relatively shifts the optical beam shaping device in the conveying direction with respect to the plurality of light modulating elements.

According to this configuration, the conveying device conveys the subject to be exposed in a given direction, with the subject to be exposed placed on the upper surface thereof. The control device individually drives the plurality of light modulating elements of the spatial light modulating device, which are composed of the electro-optical crystalline material, and arranged at a predetermined pitch at least in one row in the direction intersecting the conveying direction of the subject to be exposed in the plane parallel to the upper surface of the conveying device, with the cross-sectional shape thereof that orthogonally intersects the optical axis being formed in the substantially rectangular shape which is long in the conveying direction of the subject to be exposed, the light modulating elements being formed tilted by the predetermined angle with respect to the axis parallel to the conveying direction, to generate a predetermined pattern by on/off-controlling light transmitted through the spatial light modulating device. Moreover, the control device relatively shifts the optical beam shaping device, which limits the width of light entering into each light modulating element or emitted from each light modulating element in the conveying direction to a predetermined width, in the conveying direction with respect to the plurality of light modulating elements.

Moreover, in a second aspect, the respective light modulating elements are arranged in two rows away from each other by a predetermined distance in the conveying direction of the subject to be exposed. As a result, a predetermined pattern is generated by the plurality of light modulating elements arranged in two rows away from each other by the predetermined distance in the conveying direction of the subject to be exposed.

Furthermore, in a third aspect, the optical beam shaping device is provided with a shading mask having an elongated opening formed long in the direction intersecting the conveying direction of the subject to be exposed, to limit the width of light entering into each light modulating element or emitted from each light modulating element in the conveying direction to the predetermined width. As a result, the width of light entering into each light modulating element or emitted from each light modulating element in the conveying direction is limited to the predetermined width by the optical beam shaping device, which includes the shading mask having the elongated opening formed long in the direction intersecting the conveying direction of the subject to be exposed.

Moreover, in a fourth aspect, the optical beam shaping device includes an elongated cylindrical lens, which is long in the direction intersecting the conveying direction of the subject to be exposed, thereby limiting the width of light entering into each light modulating element in the conveying direction to a predetermined width. As a result, the optical beam shaping device including the elongated cylindrical lens, which is long in the direction intersecting the conveying direction of the subject to be exposed, limits the width of light entering into each light modulating element in the conveying direction to the predetermined width.

Furthermore, in a fifth aspect, in the case in which an irradiation position of light transmitted through each light modulating element onto the subject to be exposed is to be displaced in the direction intersecting the conveying direction of the subject to be exposed, if the displacement amount is equal to or larger than the integral multiple of an arrangement pitch of the respective light modulating elements, the control device shifts the respective light modulating elements by a distance equal to the integral multiple of the arrangement pitch and drives the light modulating elements. A displacement amount less than the arrangement pitch is set by shifting the optical beam shaping device by a predetermined distance in the conveying direction of the subject to be exposed. As a result, in the case in which the irradiation position of light transmitted through each light modulating element onto the subject to be exposed is displaced in the direction intersecting the conveying direction of the subject to be exposed, when the displacement amount is equal to or larger than the integral multiple of the arrangement pitch of the respective light modulating elements, the control device shifts the respective light modulating elements by a distance equal to the integral multiple of the arrangement pitch and drives the light modulating elements, and the displacement amount less than the arrangement pitch is set by the control device shifting the optical beam shaping device by the predetermined distance in the conveying direction of the subject to be exposed.

Moreover, in a sixth aspect, when the width of light limited by the optical beam shaping device in the conveying direction is w, a distance between the two rows of the plurality of light modulating elements arranged therein is set to nw (n is a positive integer). The control device transfers a predetermined drive pattern to the respective light modulating elements in one row arranged on the front side in the conveying direction, of the light modulating elements in two rows, every time the subject to be exposed is shifted by w, and transfers the same drive pattern as the drive pattern transferred n-times before with respect to the respective light modulating elements in one row on the front side in the conveying direction to the respective light modulating elements in one row on the rear side in the conveying direction. As a result, the optical beam shaping device limits the width of light in the conveying direction to w. The control device transfers a predetermined drive pattern to the respective light modulating elements in one row on the front side in the conveying direction, of the plurality of light modulating elements in two rows away from each other by nw (n is a positive integer), and transfers the same drive pattern as the drive pattern transferred n-times before to the respective light modulating elements in one row on the front side in the conveying direction, to the respective light modulating elements in one row on the rear side in the conveying direction.

According to the first aspect of the invention, a cross-sectional shape that orthogonally intersects the optical axis of each light modulating element is formed in a substantially rectangular shape which is long in the conveying direction of the subject to be exposed, and the light modulating element is formed tilted by a predetermined angle with respect to an axis parallel to the conveying direction, and the optical beam shaping device is relatively shifted in the conveying direction of the subject to be exposed with respect to the plurality of light modulating elements, thereby enabling to displace the irradiation position of the predetermined pattern generated by the spatial light modulating device onto the subject to be exposed in a direction intersecting the conveying direction of the subject to be exposed. In this case, the pattern can be linearly shifted in the direction intersecting the conveying direction according to a shift amount of the optical beam shaping device, and alignment between the pattern and the exposure position of the subject to be exposed can be performed with high accuracy equal to or less than the resolution of the exposure pixel irradiated onto the subject to be exposed.

Moreover, according to the second and sixth aspects of the invention, an unexposed portion between the plurality of exposure pixels by the plurality of light modulating elements in one row positioned on the rear side in the conveying direction can be supplemented and exposed by the plurality of exposure pixels by the light modulating elements in one row positioned on the front side in the conveying direction.

Furthermore, according to the third aspect of the invention, the shading mask having the elongated opening formed therein can limit the width of light entering into each light modulating element or emitted from each light modulating element in the conveying direction to a predetermined width. Therefore, the optical beam shaping device can be formed with a simple configuration.

Moreover, according to the fourth aspect of the invention, the elongated cylindrical lens can limit the width of light entering into each light modulating element in the conveying direction to a predetermined width. Therefore, the cylindrical lens can collect light and cause collected light to enter into each light modulating element, thereby enabling to enhance the use efficiency of light.

Furthermore, according to the fifth aspect of the invention, in the case in which the irradiation position of light transmitted through each light modulating element onto the subject to be exposed is displaced in the direction intersecting the conveying direction of the subject to be exposed, even if the displacement amount thereof is equal to or larger than the integral multiple of the arrangement pitch of the respective light modulating elements, the irradiation position can be displaced by an amount substantially matching the displacement amount. Therefore, alignment between the pattern and the exposure position of the subject to be exposed can be performed highly accurately.

BRIEF DESCRIPTION OF DRAWINGS

FIGS. 3A to 3C are a three-view of a relevant part of a light modulating element assembly of the spatial light modulating device, in which FIG. 3A is a plan view, FIG. 3B is a right side view, and FIG. 3C is a sectional view along line O-O of FIG. 3A;

FIGS. 4A and 4B are explanatory views of an operation of the spatial light modulating device, in which FIG. 4A shows an OFF state and FIG. 4B shows an ON state;

DESCRIPTION OF THE PREFERRED EMBODIMENTS

Figure 1:
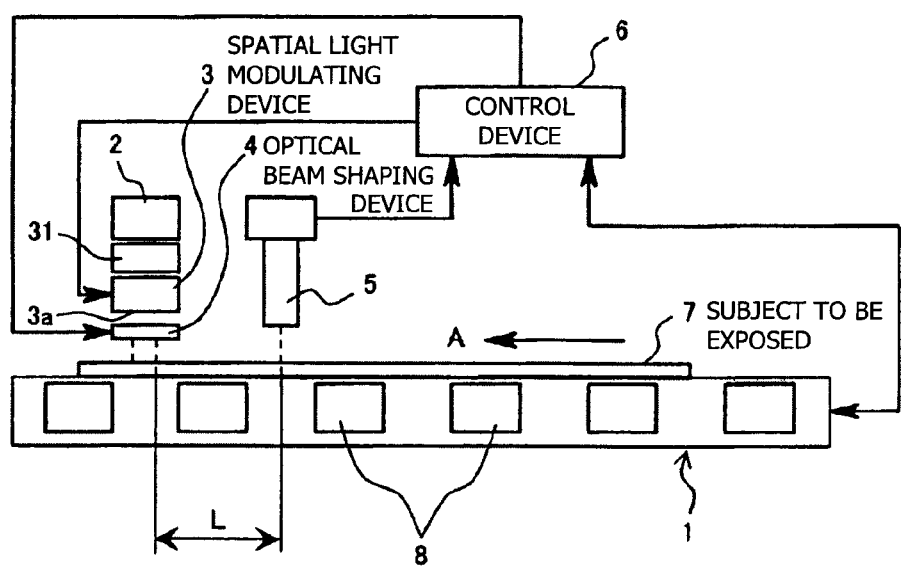
FIG. 1 is a schematic configuration view of an exposure apparatus according to an embodiment of the present invention.

Hereunder is a detailed description of an embodiment of the present invention, based on the accompanying drawings. FIG. 1 is a schematic configuration view showing an exposure apparatus according to the embodiment of the present invention. The exposure apparatus generates a predetermined pattern by means of a plurality of light modulating elements composed of an electro-optical crystalline material, and exposes the pattern on a subject to be exposed, while conveying the subject to be exposed in a given direction, and includes a conveying device 1, an exposure light source 2, a spatial light modulating device 3, an optical beam shaping device 4, an imaging device 5, and a control device 6.

The conveying device 1 conveys the subject to be exposed 7 in a given direction, with the subject to be exposed 7 placed on the upper surface thereof. In the conveying device 1, a plurality of unit stages 8 having a plurality of ejection holes for ejecting gas and a plurality of suction holes for sucking gas on the upper surface thereof are provided in proximity in a row arrangement in the conveying direction of the subject to be exposed 7, to support opposite ends of the subject to be exposed 7 by a carrier roller (not shown) to convey the subject to be exposed 7 in a direction of arrow A in FIG. 1, in a state with the subject to be exposed 7 floated on the unit stage 8 by a predetermined amount by means of a balance between ejection and suction of the gas.

The exposure light source 2 is arranged above the conveying device 1. The exposure light source 2 radiates light to the spatial light modulating device 3 described later, and is; a laser oscillator which radiates ultraviolet light, a xenon lamp, an extra high pressure mercury lamp, or the like.

Figure 2:
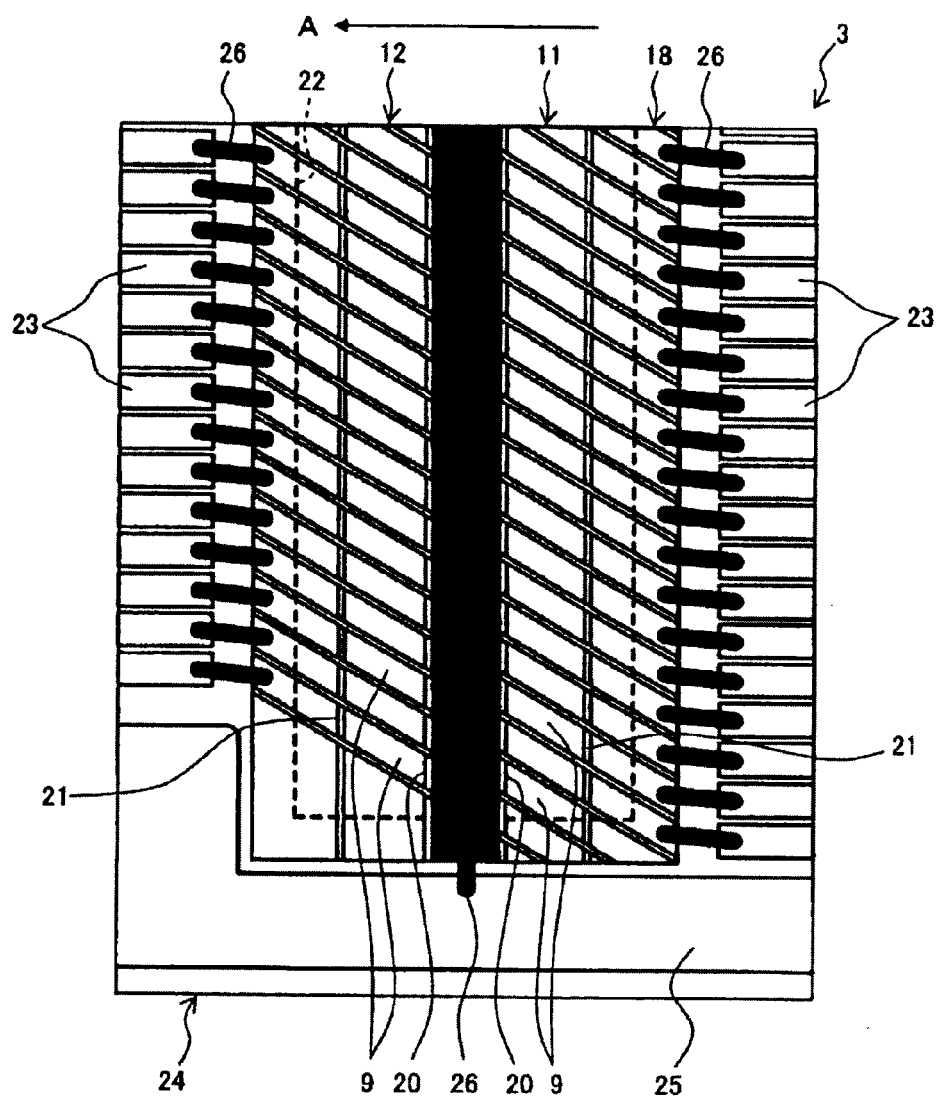
FIG. 2 is an enlarged plan view of a relevant part of a spatial light modulating device used in the exposure apparatus.
Figure 3A:
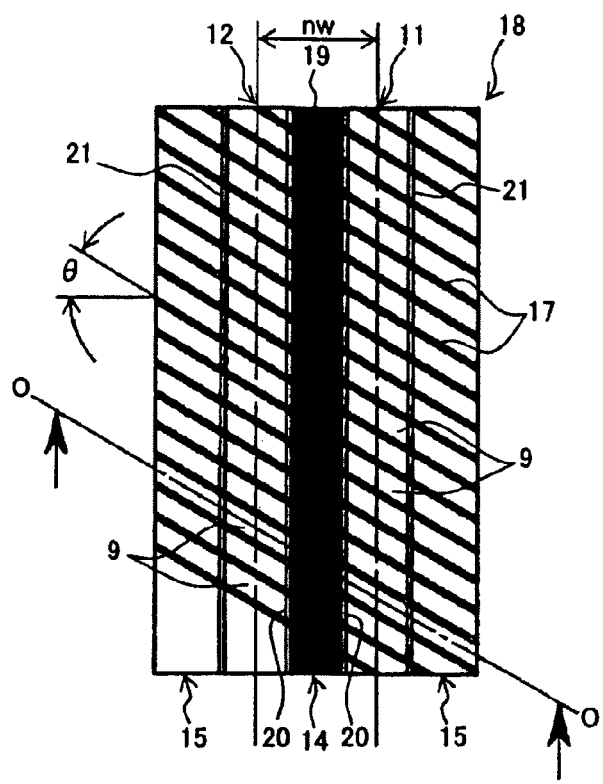
Figure 3B:
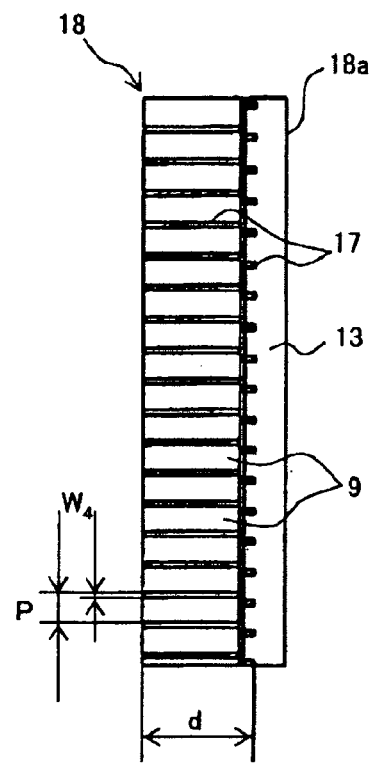
Figure 3C:
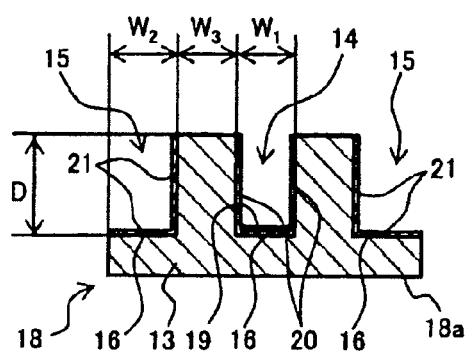

The spatial light modulating device 3 is arranged between the conveying device 1 and the exposure light source 2, with a surface 3a on a light emitting side facing the upper surface of the conveying device 1. The spatial light modulating device 3 generates a predetermined pattern by means of transmitted light, and irradiates the pattern onto the subject to be exposed 7. In the spatial light modulating device 3, as shown in FIG. 2, a plurality of light modulating elements 9 composed of an electro-optical crystalline material such as $LiNbO_3$, which rotate and control a polarization plane of linear polarization, are arranged with an arrangement pitch P (refer to FIGS. 3A to 3C) on a plane parallel to the upper surface of the conveying device 1 in a direction intersecting (substantially orthogonal to) the conveying direction (direction of arrow A) of the subject to be exposed 7, and are formed in two rows. In this case, a cross-sectional shape of each light modulating element 9 orthogonal to the optical axis is formed in a substantially rectangular shape, which is long in the conveying direction of the subject to be exposed 7, and as shown in FIGS. 3A to 3C, the light modulating elements 9 are formed tilted by a predetermined angle θ with respect to an axis orthogonal to an arrangement direction thereof (an axis parallel to the conveying direction of the subject to be exposed 7). Furthermore, the configuration is such that common polarization plates 10A and 10B (refer to FIGS. 4A and 4B) are arranged on the light incident side and light emission side of the plurality of light modulating elements 9 in a crossed Nicols configuration such that respective polarization axes are orthogonal to each other. Of the light modulating elements 9 in two rows, the light modulating elements 9 in one row positioned on the rear side in the conveying direction of the subject to be exposed 7 (the direction of arrow A) shown in FIG. 2 are referred to as a first element array 11, and the light modulating elements 9 in one row positioned on the front side in the conveying direction (the direction of arrow A) are referred to as a second element array 12.

The spatial light modulating device 3 can be formed, for example, in the following manner. That is, as shown in FIGS. 3A to 3C, a groove 14 having a width $W_1$ and a depth D, is formed in a strip-like electro-optical crystalline material 13 having a predetermined thickness along a long axis by using, for example, a dicing saw, and opposite side portions of the electro-optical crystalline material 13 parallel to the groove 14 are cut with the depth D and a width $W_2$. At this time, a width $W_3$ at a portion sandwiched between the groove 14 and a cut portion 15 of the electro-optical crystalline material 13 is a width of the light modulating element 9 in the conveying direction of the subject to be exposed 7, and is set so as to be larger than a width w of an opening 29 in the optical beam shaping device 4 described later. Moreover, a distance between center lines of the portions sandwiched between the groove 14 and the cut portion 15 is set to give nw (n is a positive integer).

Subsequently, a conducting layer 16 is formed according to a well-known film forming technique such as; sputtering, vapor deposition, or CVD on an inner surface of the groove 14 and the cut portion 15. Subsequently, a plurality of isolation trenches 17 having a width $W_4$ and a depth d (>D) tilted by the angle θ with respect to the axis orthogonal to the long axis of the electro-optical crystalline material 13, are formed with the pitch P by using, for example, the dicing saw, to form a light modulating element assembly 18 in which the first and second element arrays 11 and 12 are arranged parallel to each other. Thereafter, for example, a conductive paste 19 is applied to the bottom of the groove 14. As a result, the conducting layers 16 formed on the side faces of the groove 14 of each light modulating element 9 of the first and second element arrays 11 and 12 become a common electrode (ground electrode) 20, and the conducting layers 16 formed on the opposite side faces of the groove 14 of each light modulating element 9 become a driving electrode 21. In the present embodiment, the size of each portion is determined so that the second element array 12 is displaced with respect to the first element array 11 substantially in a direction orthogonal to the conveying direction of the subject to be exposed 7, and each light modulating element 9 in the second element array 12 can supplement portions between the respective light modulating elements 9 in the first element array 11. Furthermore, the conducting layer 16 is formed as a base film of the respective electrodes, and a good conductor film such as gold or copper can be formed by plating on the conducting layer 16 after fabrication of the light modulating element assembly 18.

Figure 4A:
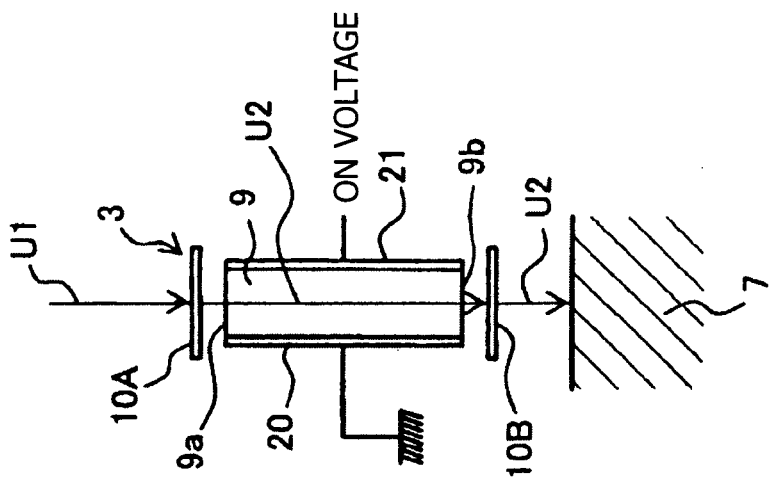
Figure 4B:
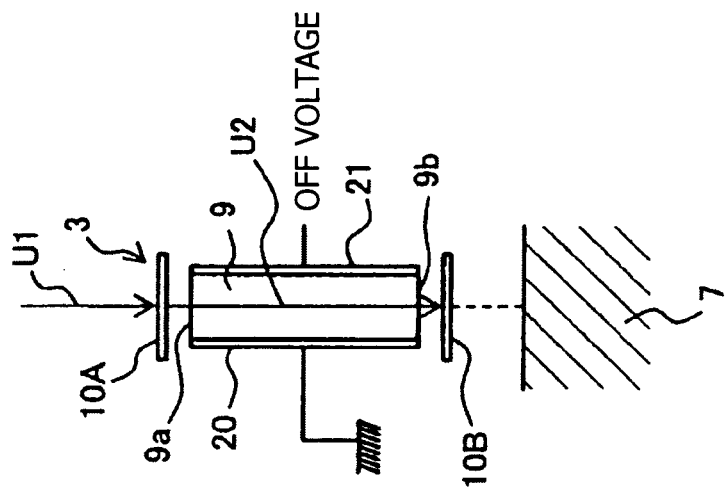

Moreover, as shown in FIG. 2, an opening 22 is formed corresponding to a forming region of each light modulating element 9, on a surface 18a of the light modulating element assembly 18 on the light emission side, and a plurality of electrode terminals 23 are formed along the opposite ends of the opening 22 parallel to the long axis of the opening 22. The light modulating element assembly 18 is fitted on a wiring substrate 24 on which a ground electrode terminal 25 is formed near an end parallel to a short axis, with the forming region thereof on the surface 18a on the light emission side matched with the opening 22, to electrically connect the electrode terminals 23 of the wiring substrate 24 with the driving electrode 21 of each light modulating element 9, and the ground electrode terminal 25 of the wiring substrate 24 with the ground electrode 20 of the light modulating elements 9, by wire bonding or the like by means of a conductive wire 26 such as gold. Furthermore, as shown in FIGS. 4A and 4B, the common polarization plates 10A and 10B are arranged on the light incident side and the light emission side of each light modulating element 9 in a crossed Nicols configuration such that the respective polarization axes are orthogonal to each other, thereby completing the spatial light modulating device 3.

The spatial light modulating device 3 thus formed operates in the following manner. That is, as shown in FIGS. 4A and 4B, an ultraviolet source light U1 radiated from the exposure light source 2 is changed to linear polarized light U2 by the polarization plate 10A and enters into an incident end face 9a of the light modulating element 9. In this case, as shown in FIG. 4A, when voltage is not applied to the driving electrode 21 of the light modulating element 9, the light modulating element 9 is turned off, and the polarization plane of the linear polarized light U2 passing through the light modulating element 9 is not rotated. Therefore, because the polarization plane of the linear polarized light U2 emitted from the emission end face 9b of the light modulating element 9 is orthogonal to a polarization axis of the polarization plate 10B, the linear polarized light U2 is blocked by the polarization plate 10B.

On the other hand, as shown in FIG. 4 B, when a predetermined voltage is applied to the driving electrode 21 of the light modulating element 9, the light modulating element 9 is turned on, to rotate the polarization plane of the linear polarized light U2 passing through the light modulating element 9 by 90 degrees. Accordingly, the polarization plane of the linear polarized light U2 emitted from the emission end face 9b of the light modulating element 9 coincides with the polarization axis of the polarization plate 10B, and the linear polarized light U2 passes through the polarization plate 10B. In this way, ultraviolet light emitted from the spatial light modulating device 3 can be turned on/off by on/off control of the drive of each light modulating element 9.

Figure 5:
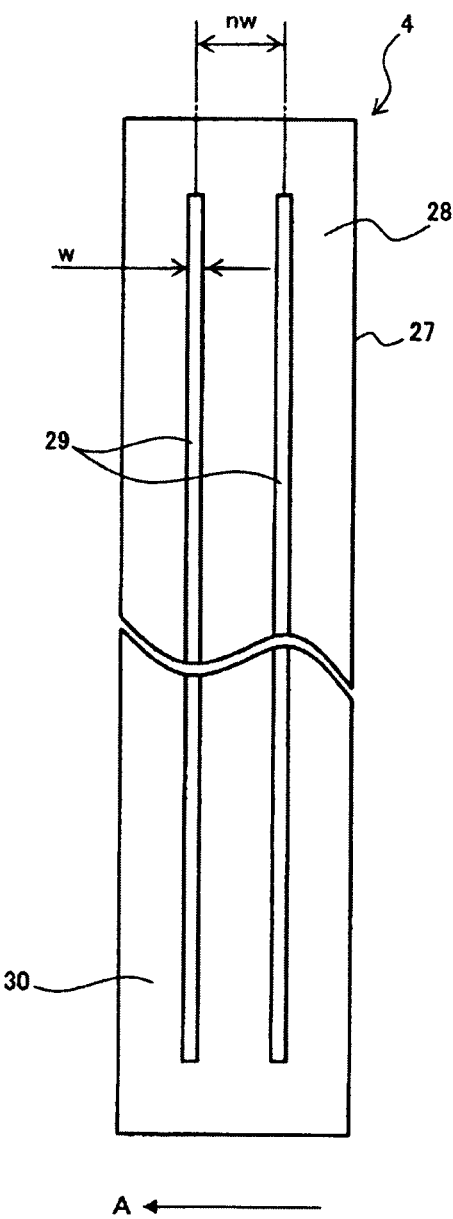
FIG. 5 is a plan view of a shading mask of an optical beam shaping device used in the exposure apparatus.

The optical beam shaping device 4 is provided adjacent to the emission side end face 3a of the spatial light modulating device 3. The optical beam shaping device 4 limits the width of light emitted from each light modulating element 9 of the spatial light modulating device 3 in the conveying direction of the subject to be exposed 7 as shown by arrow A, to a predetermined width. As shown in FIG. 5, the optical beam shaping device 4 includes a shading mask 30 having the elongated opening 29, which is long in a direction intersecting (substantially orthogonal to) the conveying direction and has the width w, formed on a shading film 28 deposited on a surface of a transparent substrate 27. The optical beam shaping device 4 is controlled by the control device 6 described later, and is formed so as to be movably in the conveying direction of the subject to be exposed 7 by, for example, an electromagnetic or piezoelectric actuator. In this case, two openings 29 are formed parallel to each other in a state with long axes thereof coinciding with long axes of the first and second element arrays 11 and 12, and the width w ($<W_3$) thereof in the short axis direction regulates the width of the exposure pixel in the conveying direction. The shading mask 30 may be one in which a slit is formed in a shading plate.

The imaging device 5 is provided away from the first element array 11 of the spatial light modulating device 3 by a distance L in a direction opposite to the conveying direction (direction of arrow A) of the subject to be exposed 7. For example, the imaging device 5 captures an image of a reference pattern formed beforehand on the subject to be exposed 7 by means of the transmitted light of illumination light irradiated by an illuminating device (not shown), from below the subject to be exposed 7, and is a line camera in which plural light receiving elements are arranged in alignment with each other in a direction substantially orthogonal to the conveying direction shown by arrow A in FIG. 1 in the plane parallel to the upper surface of the conveying device 1.

In FIG. 1, reference numeral 31 denotes a coupling optical system that equalizes the intensity distribution of light radiated from the exposure light source 2 and changes the light to parallel light.

Figure 6:
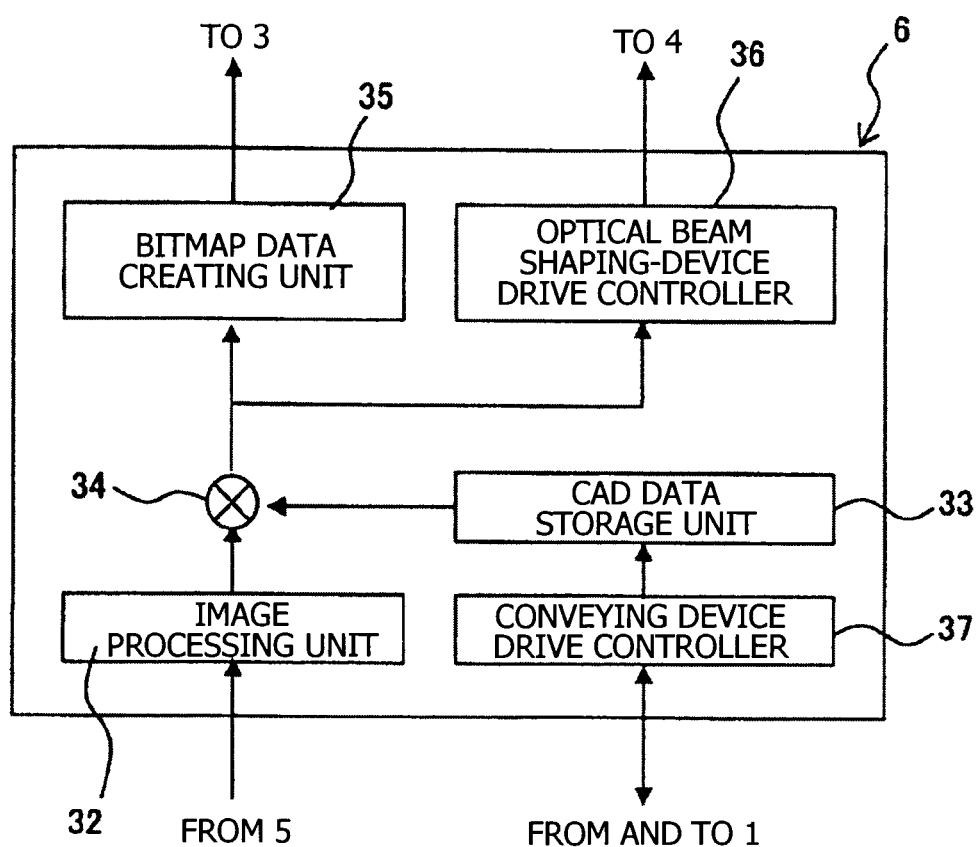
FIG. 6 is a block diagram of a schematic configuration of a control device used in the exposure apparatus.

The control device 6 is electrically connected to; the conveying device 1, the spatial light modulating device 3, and the imaging device 5. The control device 6 individually controls driving of each light modulating element 9 of the spatial light modulating device 3 to generate a predetermined pattern, and as shown in FIG. 6, includes an image processing unit 32, a CAD data storage unit 33, a comparator 34, a bitmap data creating unit 35, an optical beam shaping-device drive controller 36, and a conveying device drive controller 37.

Here the image processing unit 32 processes an image on the surface of the subject to be exposed 7 captured by the imaging device 5 to generate image data. Moreover, the CAD data storage unit 33 stores CAD data of all exposure patterns corresponding to an exposure area on the surface of the subject to be exposed 7, and the CAD data storage unit 33 is a memory, a CD-ROM, or the like. Furthermore, the comparator 34 compares the image data generated by the image processing unit 32 with the CAD data read from the CAD data storage unit 33 corresponding to the image data, and also performs a function of detecting a displacement amount between the both image data. Moreover, the bitmap data creating unit 35 creates bitmap data (a drive pattern of the light modulating element 9) shifted in the direction substantially orthogonal to the conveying direction of the subject to be exposed 7 by the integral multiple including zero of the arrangement pitch of the plurality of light modulating elements 9 of the spatial light modulating device 3 corresponding to the displacement amount. Furthermore, the optical beam shaping-device drive controller 36 shifts the optical beam shaping device 4 in the conveying direction of the subject to be exposed 7 by a distance corresponding to a displacement amount less than the arrangement pitch of the plurality of light modulating elements 9, of the above displacement amount. Moreover, the conveying device drive controller 37 controls driving of the conveying device 1 so that the subject to be exposed 7 is conveyed in the direction of arrow A at a predetermined speed, and operates so that predetermined CAD data is sequentially transferred from the CAD data storage unit 33 to the comparator 34, based on an output of a position sensor provided in the conveying device 1, every time the subject to be exposed 7 is conveyed by the distance w after the first exposure position of the subject to be exposed 7 on the reference pattern has been captured by the imaging device 5.

Next is an explanation of an exposure operation of the exposure apparatus configured in this manner.

First, after the exposure light source 2 is turned on, an image at the exposure position on the reference pattern formed on the surface of the subject to be exposed 7 is captured by the imaging device 5, while the subject to be exposed 7 is conveyed in the direction of arrow A. The captured image is subjected to image processing by the image processing unit 32 of the control device 6, and is converted to image data. Then the image data is compared with the corresponding CAD data read from the CAD data storage unit 33 by the comparator 34, to detect a displacement amount between the both image data in the direction substantially orthogonal to the conveying direction.

In this case, when the displacement amount is $(mP+\alpha)$ (P denotes an arrangement pitch of the light modulating elements 9, m denotes an integer including zero, and $-P<\alpha<P$), the bitmap data creating unit 35 creates bitmap data shifted by mP in the direction substantially orthogonal to the conveying direction of the subject to be exposed 7, and transfers the bitmap data to the first element array 11 of the spatial light modulating device 3. Moreover, the optical beam shaping-device drive controller 36 calculates $\alpha/\tan\theta$ based on the displacement amount a to calculate a shift amount $\Delta x$ of the optical beam shaping device 4, generates a drive signal corresponding to the shift amount $\Delta x$, and transmits the drive signal to the optical beam shaping device 4. Then the optical beam shaping device 4 is shifted by the shift amount $\Delta x$ in the conveying direction (direction of arrow A) of the subject to be exposed 7. As a result, the displacement amount mP corresponding to the integral multiple of the arrangement pitch P of the light modulating elements 9 can be corrected by creating the bitmap data shifted by mP, and the displacement amount a less than the arrangement pitch P can be corrected by shifting the optical beam shaping device 4 in the conveying direction of the subject to be exposed 7.

Figure 7B:
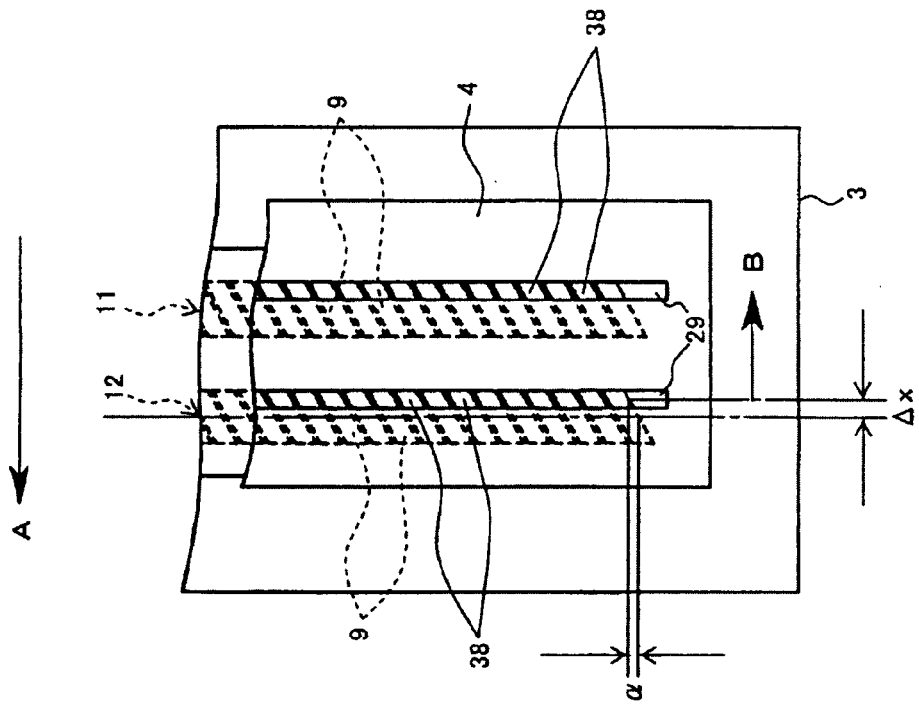
FIGS. 7A and 7B are explanatory views of misregistration correction performed by shifting the optical beam shaping device, being a view of the spatial light modulating device as seen from the optical beam shaping device.
Figure 7A:
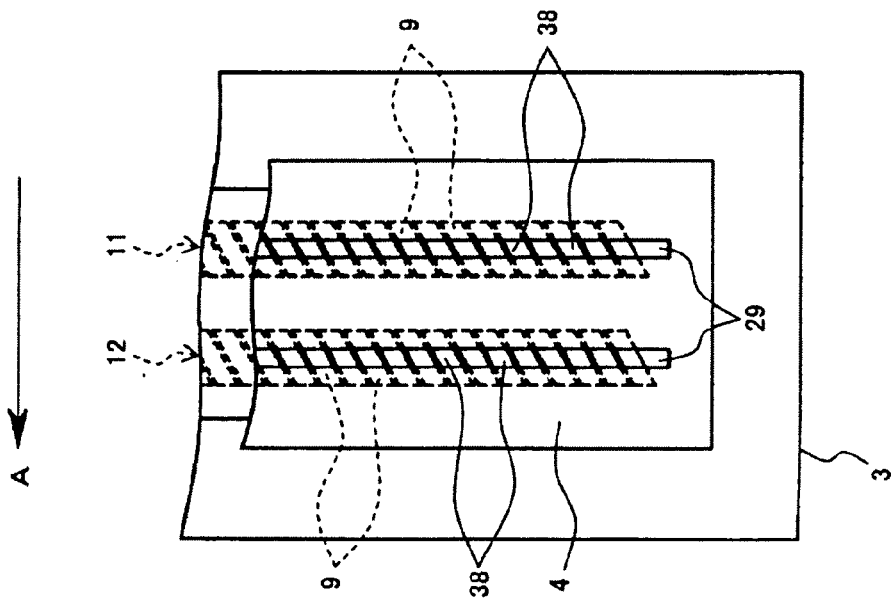

FIGS. 7A and 7B are explanatory views showing misregistration correction performed by shifting the optical beam shaping device 4, being a view of the spatial light modulating device 3 as seen from the optical beam shaping device 4. FIG. 7A shows a state in which the two openings 29 in the optical beam shaping device 4 are at a reference position at which the long axes of the openings 29 coincide with the long axes of the first and second element arrays 11 and 12 of the spatial light modulating device 3. Here in order to correct the displacement amount $\alpha$, as shown in FIG. 7B, the optical beam shaping device 4 is shifted by $\Delta x=\alpha/\tan\theta$ in the conveying direction of the subject to be exposed 7 (in FIG. 7B, opposite to the conveying direction and in a direction shown by arrow B). As a result, the exposure pixels 38, which are modulated by the spatial light modulating device 3, and pass through the opening 29 of the optical beam shaping device 4, and are irradiated onto the subject to be exposed 7, are shifted by a distance $\alpha$ in the direction substantially orthogonal to the conveying direction of the subject to be exposed 7 with respect to the reference position. In this manner, the displacement amount $\alpha$ is corrected.

The explanation above is focused on alignment between the pattern generated by the spatial light modulating device 3 and the exposure position of the subject to be exposed 7, and hence, transfer timing of the bitmap data to the spatial light modulating device 3 and shift timing of the optical beam shaping device 4 are ignored. In the present embodiment, actually, the imaging position of the imaging device 5 and the exposure position of the spatial light modulating device 3 are away from each other by the distance L in the conveying direction of the subject to be exposed 7. Therefore, the subject to be exposed 7 is conveyed by the distance L after the exposure position on the subject to be exposed 7 is detected based on the captured image of the imaging device 5, and the bitmap data shifted by mP is transferred from the bitmap data creating unit 35 to the first element array 11 at a timing at which the exposure position reaches a position corresponding to the opening 29 in the optical beam shaping device 4, below the first element array 11 of the spatial light modulating device 3. On the other hand, the optical beam shaping device 4 is shifted by the distance $\Delta x$ while the subject to be exposed 7 is conveyed by the distance L after the exposure position on the subject to be exposed 7 is detected based on the captured image of the imaging device 5.

As a matter of course, the drive timing of the spatial light modulating device 3 is changed according to the shift amount $\Delta x$ of the optical beam shaping device 4 from the reference position at which the long axes of the respective element arrays 11 and 12 of the spatial light modulating device 3 coincide with the long axes of the respective openings 29 of the optical beam shaping device 4. Moreover, the bitmap data can be transferred to the spatial light modulating device 3 immediately after it is created by the bitmap data creating unit 35, and stored in a storage device (not shown) provided in the spatial light modulating device 3.

Thereafter, predetermined bitmap data is transferred from the bitmap data creating unit 35 to the first element array 11 of the spatial light modulating device 3, every time the subject to be exposed 7 is conveyed by the distance w, and each light modulating element 9 of the first element array 11 is driven based on the bitmap data to generate a predetermined pattern, and the predetermined pattern is exposed at a predetermined position on the subject to be exposed 7.

Figure 8:
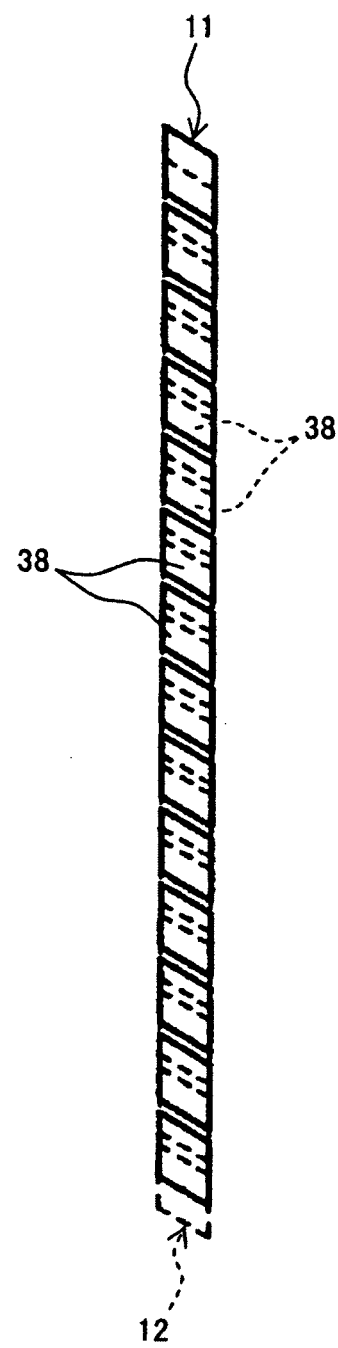
FIG. 8 is an explanatory view of that an unexposed portion between a plurality of exposure pixels by a first element array of the spatial light modulating device is supplemented by a second element array to perform superimposed exposure.

On the other hand, the same bitmap data as the bitmap data transferred to the first element array 11 n times before is transferred to the second element array 12 of the spatial light modulating device 3. As a result, as shown in FIG. 8, the predetermined pattern can be exposed by the second element array 12, superimposed on the plurality of exposure pixels 38 exposed n times before by the first element array 11. In this case, the second element array 12 is formed so that each light modulating element 9 can supplement a portion between the respective light modulating elements 9 in the first element array 11, and hence, an unexposed portion between the respective exposure pixels of the first element array 11 can be supplemented by the exposure pixels 38 of the second element array 12.

In the present embodiment, a case in which the spatial light modulating device 3 includes the first and second element arrays 11 and 12 has been described. However, the present invention is not limited thereto, and the spatial light modulating device 3 may include only the first element array 11.

Moreover, in the present embodiment, a case in which the optical beam shaping device 4 is provided adjacent to the emission side end face 3a of the spatial light modulating device 3 has been described. However, the present invention is not limited thereto, and the optical beam shaping device 4 may be provided adjacent to the incident side end face of the spatial light modulating device 3.

Furthermore, in the present embodiment, a case in which the optical beam shaping device 4 includes the shading mask 30 having the opening 29 for transmitting light has been described. However, the present invention is not limited thereto, and the optical beam shaping device 4 may include a cylindrical lens that generates linear optical beams by narrowing down incident light only to a uniaxial direction (the conveying direction of the subject to be exposed 7) of biaxial directions orthogonal to each other.

It should be appreciated that the entire contents of Japanese Patent Application No. 2009-043981, filed on Feb. 26, 2009, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. An exposure apparatus comprising:
a conveying device that places a subject to be exposed on an upper surface thereof and conveys the subject to be exposed in a given direction;
a spatial light modulating device having a plurality of substantially rectangular light modulating elements, which are composed of an electro-optical crystalline material and arranged at a predetermined pitch at least in one row in a direction orthogonal to a conveying direction of the subject to be exposed in a plane parallel to the upper surface of the conveying device, wherein a cross-sectional shape of each light modulating element that orthogonally intersects an optical axis has a long axis extending along the conveying direction of the subject to be exposed, wherein the light modulating element is formed tilted by a predetermined angle with respect to an axis parallel to the conveying direction;
an optical beam shaping device that limits the width of light entering into each light modulating element or emitted from each light modulating element in the conveying direction to a width that is narrower than a width of the light modulating element in the conveying direction; and
a control device that on/off-controls light transmitted through the spatial light modulating device by individually driving each light modulating element so as to generate a predetermined pattern, wherein, in the case in which an irradiation position of light transmitted through each light modulating element onto the subject to be exposed is to be displaced in the direction intersecting the conveying direction of the subject to be exposed, if the displacement amount is equal to or larger than the integral multiple of an arrangement pitch of the respective light modulating elements, the control device shifts the respective light modulating elements by a distance equal to the integral multiple of the arrangement pitch and drives the light modulating elements, and if the displacement amount is less than the arrangement pitch, the control device shifts the optical beam shaping device by a predetermined distance in the conveying direction with respect to the light modulating elements.

2. An exposure apparatus according to claim 1, wherein the respective light modulating elements are arranged in two rows away from each other by a predetermined distance in the conveying direction of the subject to be exposed.

3. An exposure apparatus according to claim 2, wherein
when the width of light limited by the optical beam shaping device in the conveying direction is w,
a distance between the two rows of the light modulating elements arranged therein is set to nw (n is a positive integer), and
the control device transfers a predetermined drive pattern to the respective light modulating elements in one row arranged on the front side in the conveying direction, of the light modulating elements in two rows, every time the subject to be exposed is shifted by w, and transfers the same drive pattern as the drive pattern transferred n-times before with respect to the respective light modulating elements in one row on the front side in the conveying direction to the respective light modulating elements in one row on the rear side in the conveying direction.

4. An exposure apparatus according to claim 1, wherein the optical beam shaping device is provided with a shading mask having an elongated opening formed long in the direction intersecting the conveying direction of the subject to be exposed, to limit the width of light entering into each light modulating element or emitted from each light modulating element in the conveying direction to the predetermined width.

* * * * *